(12) United States Patent
Nishikawa (10) Patent No.: US 8,581,216 B2
(45) Date of Patent: Nov. 12, 2013

(54) MANUFACTURING METHOD OF SEMICONDUCTOR DEVICE, METHOD FOR CONTROLLING ION BEAM, AND ION IMPLANTATION APPARATUS

(75) Inventor: Katsunari Nishikawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 101 days.

(21) Appl. No.: 12/893,687

(22) Filed: Sep. 29, 2010

(65) Prior Publication Data

US 2011/0012034 A1 Jan. 20, 2011

Related U.S. Application Data

(63) Continuation of application No. PCT/JP2008/056438, filed on Mar. 31, 2008.

(51) Int. Cl.
*H01J 37/08* (2006.01)
*H01J 37/317* (2006.01)
*H01L 21/02* (2006.01)

(52) U.S. Cl.
USPC .................................... 250/492.21

(58) Field of Classification Search
USPC .............. 250/492.1, 492.2, 492.21, 492.3, 250/396 ML
See application file for complete search history.

(56) References Cited

U.S. PATENT DOCUMENTS

| | | | | |
|---|---|---|---|---|
| 3,784,909 A | * | 1/1974 | Schutt et al. | 324/71.1 |
| 5,629,528 A | * | 5/1997 | Jost et al. | 250/492.21 |
| 6,403,972 B1 | * | 6/2002 | Cucchetti et al. | 250/492.21 |
| 7,247,867 B2 | | 7/2007 | Itokawa et al. | |
| 7,772,573 B2 | * | 8/2010 | Igo et al. | 250/492.21 |
| 2002/0014649 A1 | * | 2/2002 | Kunikiyo | 257/306 |
| 2004/0038555 A1 | * | 2/2004 | Sugita et al. | 438/785 |
| 2005/0269527 A1 | * | 12/2005 | Murrell et al. | 250/492.21 |
| 2006/0076510 A1 | * | 4/2006 | Chang et al. | 250/492.21 |

(Continued)

FOREIGN PATENT DOCUMENTS

| | | |
|---|---|---|
| JP | 2-025157 U | 2/1990 |
| JP | 3-105839 A | 5/1991 |

(Continued)

OTHER PUBLICATIONS

International Search Report of PCT/JP2008/056438, mailing date Jul. 1, 2008.

*Primary Examiner* — David A Vanore
*Assistant Examiner* — Wyatt Stoffa
(74) *Attorney, Agent, or Firm* — Westerman, Hattori, Daniels & Adrian, LLP (57) ABSTRACT

The ion implantation apparatus includes a source head, an extraction electrode having a slit trough which a part of an ion beam outputted from the source head passes, a magnet for curving a trajectory of the ion beam passed through the slit, a target to be irradiated with the ion beam outputted from the magnet, an electric current measuring device facing an ion exit port of the source head through the slit of the extraction electrode, and a control portion for controlling a position of the extraction electrode based on a measured result of the current measuring device in a state that production of a magnetic field from the magnet is stopped.

9 Claims, 9 Drawing Sheets

(56) References Cited

U.S. PATENT DOCUMENTS

| | | | |
|---|---|---|---|
| 2006/0284114 A1* | 12/2006 | Olson et al. | 250/492.21 |
| 2007/0210260 A1* | 9/2007 | Horsky et al. | 250/424 |
| 2008/0265180 A1* | 10/2008 | Itoh | 250/492.21 |
| 2009/0242808 A1* | 10/2009 | Evans | 250/492.21 |
| 2009/0261248 A1* | 10/2009 | Glavish et al. | 250/298 |
| 2010/0107980 A1* | 5/2010 | Horsky et al. | 250/423 R |
| 2011/0207278 A1* | 8/2011 | Shibata | 438/277 |

FOREIGN PATENT DOCUMENTS

| | | |
|---|---|---|
| JP | 5-067449 A | 3/1993 |
| JP | 7-153401 A | 6/1995 |
| JP | 7-169433 A | 7/1995 |
| JP | 2001-216934 A | 8/2001 |
| JP | 2003-504820 A | 2/2003 |
| JP | 2003-346700 A | 12/2003 |
| JP | 2006-019048 A | 1/2006 |

* cited by examiner

MANUFACTURING METHOD OF SEMICONDUCTOR DEVICE, METHOD FOR CONTROLLING ION BEAM, AND ION IMPLANTATION APPARATUS

CROSS-REFERENCE TO RELATED APPLICATION

This application is a U.S. continuation application filed under 35 USC 111(a) claiming benefit under 35 USC 120 and 365(c) of international application PCT/JP2008/056438, filed on Mar. 31, 2008, the entire contents of which are incorporated herein by reference.

FIELD

A certain aspect of the embodiments discussed herein is related generally to a manufacturing method of a semiconductor device, a method for controlling an ion beam, and an ion implantation apparatus.

BACKGROUND

The ion implanting method as one of the methods of introducing atoms or molecules into a target material is used in the manufacturing of a semiconductor device, and the reforming of a metal surface, and others. For example, in the manufacturing of a semiconductor device, the ion implanting method is used for imparting electrical conductivity to a polysilicon film comprising a gate electrode of MOSFET, or forming an n-type or p-type source/drain diffusion regions of MOSFET, or the like.

The ion implantation apparatus has an ion source for generating ions, an extraction electrode for extracting ions from the ion source, a separation magnet for separating the ions coming out from the ion source every mass, a lens for converging given ion species out of the separated ion species, and a wafer stage for loading thereon a wafer as the target material. The separation magnet is also called a mass analyzing magnet.

The ion implantation apparatus including such elements has different features of controlling ion-implantation angle to a wafer, or enhancing an efficiency of the ion implantation, and the like.

For example, it is known that a measuring mechanism of center-of-gravity for measuring a gravity center of the ion beam passed through the separation magnet is arranged to be able to move into and from the middle of the ion beam course, and further an angle of the wafer stage is controlled such that the irradiation direction of the ion beam measured by the center-of-gravity measuring mechanism coincides with a normal direction of the wafer.

It is known that, in order to control the ion implantation angle to the wafer, a regulating deflecting force means for regulating a deflecting force of the mass analyzing magnet is provided in the ion implantation apparatus, and further a wafer moving mechanism for moving the wafer along its surface direction is provided in the ion implantation apparatus.

Further, it is known that a mask for receiving the ion beam is provided between the ion source and the periphery of the mass analyzing magnet, then a value of a beam electric current passing through the mask is measured, and then a distance between an extraction electrode and the ion source is controlled such that the beam electric current is maximized.

Still further, it is known that values of electric currents of the ion beams with the exception of a specific mass, in plural types of ion beams separated by the mass analyzing magnet, are measured by the Faraday cup, and then an electric current of the ion beam with the specific mass is calculated indirectly based on the measured values. Thus, the electric current of the ions with the specific mass is measured while implanting the ions with the specific mass into the subject.

In this case, the Faraday cup may be arranged in the area located near a beam extracting port of the mass analyzing magnet, and then be fitted movably in the direction that intersects substantially orthogonally on the ion beam.

By the way, in the above technologies, from viewpoints of a size and a structure of a driving portion for driving the wafer stage, it is difficult that both a wafer turning mechanism and a normal angle-of-the-wafer changing mechanism are provided together.

Meanwhile, when the ion implantation angle is controlled on the condition that the ion species move to depict the ideal trajectory in the mass analyzing magnet, it is difficult to control an incident angle of the ion beam to the wafer with good precision by only regulating the magnitude of the deflecting force of the mass analyzing magnet.

Further, when used a method of connecting an ammeter to a target of the ion beam and then detecting a maximum value of the electric current of the ion beam, it is unfeasible to detect the incident position of the ion beam. Thus, it is difficult to control an incident angle of the ion beam.

SUMMARY

According to an aspect of an embodiment of the present invention, there is provided a method of manufacturing a semiconductor device including: outputting an ion beam from a source head, passing the ion beam through a slit of an extraction electrode, guiding the ion beam into a magnet, after passing the ion beam through the slit of the extraction electrode, irradiating the ion beam passing into the magnet to an electric current measuring device facing an ion exit port of the source head through the extraction electrode, measuring an electric current value with the electric current measuring device, positioning the slit of the extraction electrode based on the electric current value measured while stopping production of a magnetic field of the magnet, curving the ion beam passed through the positioned slit in a magnetic field produced by the magnet, and irradiating the ion beam curved by the magnetic field to a semiconductor substrate.

According to another aspect of another embodiment of the present invention, there is provided an ion implantation apparatus including: a source head, an extraction electrode having a slit trough which a part of an ion beam outputted from the source head passes, a magnet for curving a trajectory of the ion beam passed through the slit, a target to be irradiated with the ion beam outputted from the magnet, an electric current measuring device facing an ion exit port of the source head through the slit of the extraction electrode, and a control portion for controlling a position of the extraction electrode based on a measured result of the current measuring device in a state that production of a magnetic field from the magnet is stopped.

According to a further aspect of still another embodiment of the present invention, there is provided a method of controlling ion beam including: outputting an ion beam from a source head, passing the ion beam through a slit of an extraction electrode, irradiating the ion beam to an electric current measuring device facing an ion exit port of the source head through the extraction electrode, measuring an electric current value of the ion beam by using the current measuring device, and controlling a position of the extraction electrode based on the measured electric current value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF PREFERRED EMBODIMENT

An object of the embodiment is to provide a semiconductor device manufacturing method including controlling an ion implantation angle to a semiconductor substrate with higher precision, an ion beam controlling method capable of controlling a trajectory of an ion beam with higher precision, and an ion implantation apparatus including a mechanism for controlling an trajectory of an ion beam with higher precision.

According to the present embodiment, an electric current of an ion beam that enters in a magnet, after passing through a slit of an extraction electrode is detected by using a current measuring device, and then, an trajectory of the ion beam is controlled by controlling a position of the extraction electrode based on the measured result of the electric current. Thus, after the ion beam is curved by magnetic field of a magnet, an incident angle of the ion beam to a target such as a semiconductor substrate is controlled with high precision.

An embodiment of the present invention will be explained in detail with reference to the drawings.

Figure 1:
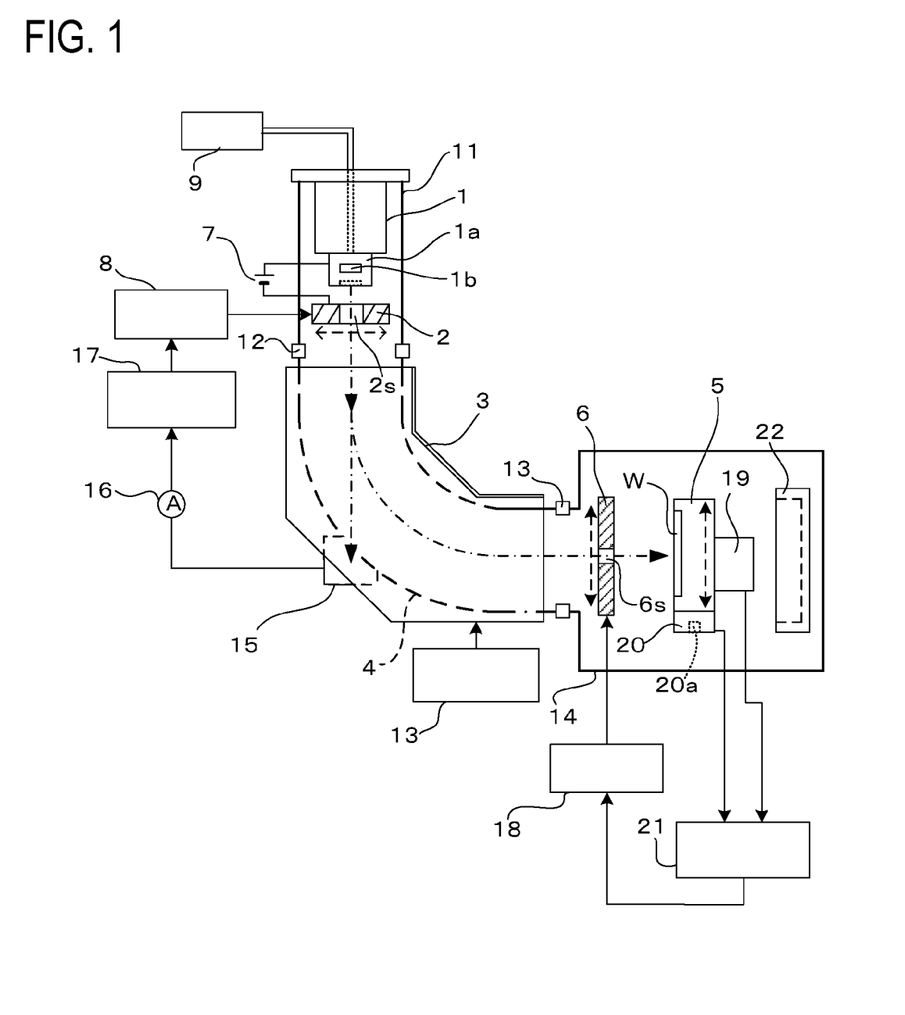
FIG. 1 is a configuration view of an example ion implantation apparatus according to an embodiment of the present invention.

FIG. 1 is a configuration view of an example ion implantation apparatus according to an embodiment.

The ion implantation apparatus has a source head 1 for generating ions of atoms or molecules, a conductive extraction electrode 2 arranged in front of the ion emission end of the source head 1, a mass analyzing magnet 3 capable of separating the ion species with respect to each mass, and a wafer stage 5 for loading a wafer W as a target of the ion implantation thereon.

Further, a mass slit electrode 6 through which an ion beam of a given mass moved in the mass analyzing magnet 3 passes is arranged in an area between the mass analyzing magnet 3 and the wafer stage 5. The mass slit electrode 6 has a mass slit 6s that is capable of shutting off a part of the ion beam.

The source head 1 and the extraction electrode 2 are fitted in a source chamber 11 respectively. The source head 1 has an arc chamber 1a including an anode, a cathode, and a filament therein, and a source magnet 1b for applying a magnetic field to the arc chamber 1a.

An acceleration power supply 7 is connected between the extraction electrode 2 and the cathode (not illustrated) in the arc chamber 1a. The acceleration power supply 7 applies the voltage to the extraction electrode 2. A polarity of the voltage sets an electric potential of the extraction electrode 2 to become lower than an electric potential of the cathode of the arc chamber 1a. Thus, ion species in the arc chamber 1a are emitted toward the extraction electrode 2.

The extraction electrode 2 has a slit 2s through which the ions emitted from the front end of the arc chamber 1a passes. Also, perpendicular and horizontal positions of the extraction electrode 2 are controlled in the direction, which intersects with the ions moving direction, by an extraction electrode moving portion 8.

A gas source 9 for supplying the atoms or the molecules serving as the ion species is connected to the source head 1. Boron fluoride ($BF_3$), phosphine ($PH_3$), or arsine ($AsH_3$), for example is used as gas sealed in the gas source 9.

The front end of the source chamber 11 is connected to the rear end of a magnet chamber 4 of the mass analyzing magnet 3 via an insulator 12.

A strength and a distribution of the magnetic field that is produced in the magnet chamber 4 by the mass analyzing magnet 3 are controlled by a signal that is sent out from a beam trajectory control circuit 13 to the mass analyzing magnet 3. The magnetic field produced in the magnet chamber 4 by the mass analyzing magnet 3 is controlled, as indicated by a dot-dash line in FIG. 1, such that this magnetic field has a strength distribution to curve the beam of a given ion species emitted from the arc chamber 1a and guide it along a given flying trajectory.

The magnet chamber 4 has such a shape that surrounds the periphery of the flying trajectory of the given ion beam, and absorbs a part of the unnecessary ion species being separated by the magnetic field by causing them to hit this shape.

In an area where the ions are implanted into the wafer W from the arc chamber 1a, the designed flying trajectory of the ion beam is a linear or straight line trajectory until the ions reach the ion introducing port of the magnet chamber 4. In the area, the designed flying trajectory is a curved trajectory in the magnet chamber 4 by an operation of the magnetic field produced by the mass analyzing magnet 3 . Further, in the area, the designed flying trajectory is the straight line trajectory which the ions are emitted from the ion emitting port of the magnet chamber 4 to the wafer W.

Meanwhile, the ions accelerated by a constant energy (voltage) have the same mass-to-charge ratio m/z (where m is a mass, and z is an electric charge) and are converged at the same point even when the trajectories of the ions are out of alignment by spreading each other. Further, this is called the direction focusing.

When an ion cluster accelerated by a constant energy pass through a uniform magnetic field in the mass analyzing magnet 3, the trajectory of the ion whose mass is lighter is curved more largely. Therefore, plural ion species are dispersed respectively.

In order to get a mass spectrum by using the mass analyzing magnet 3, the ions are converged on the wafer W or the mass slit electrode 6 by controlling the magnetic field strength of the mass analyzing magnet 3.

A kinetic energy of ions is given by $(½)\times(mv^2)=zV$ on the assumption that the ions are accelerated by an acceleration voltage V to get a velocity v. When the ion enters into a magnetic field H that is perpendicular to the ion moving direction, the ions are moved to depict a circular trajectory with a radius r. A centrifugal force of the ions is $mv^2/r$, and $mv^2/r=Hzv$, $m/z=r^2H^2/(2V)$ are obtained when a magnetic force Hzv and the centrifugal force are in balance.

The radius r is kept constant by changing the acceleration voltage V while keeping the magnetic field H constant or by changing the magnetic field H while keeping the acceleration voltage V constant. A kinetic energy of ion emitted from the ion source has a certain spread. Therefore, strictly speaking, the kinetic energy is not constant. As a result, it is impossible to separate respective ions whose masses are close mutually.

Figure 2:
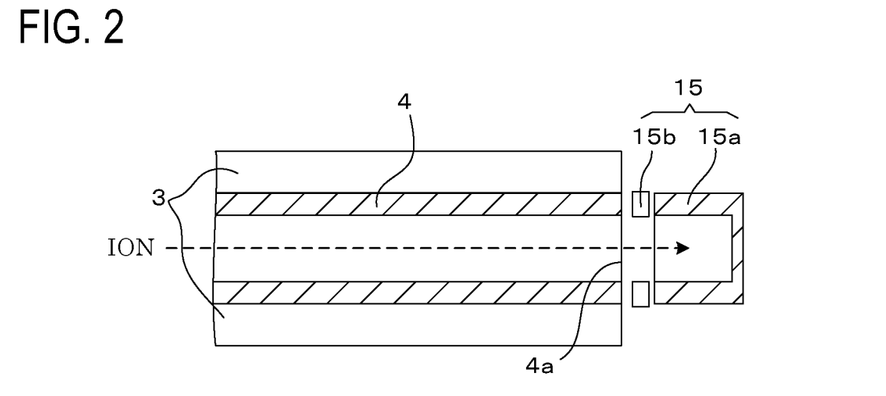
FIG. 2 is a sectional view illustrating an example of a current measuring device constituting the ion implantation apparatus according to the embodiment of the present invention.

As illustrated in a cross section of FIG. 2, an opening portion 4a is provided in the area, which is located on the straight extended line of the designed flying trajectory of the ion beam from the arc chamber 1a to an inlet of the magnet chamber 4, of the side wall of the magnet chamber 4 in which the ions forms such the ion trajectory. Also, a current measuring device 15 for receiving the ion beam that enters in the magnet chamber 4 is fitted to the outside of the opening portion 4a.

Figure 3:
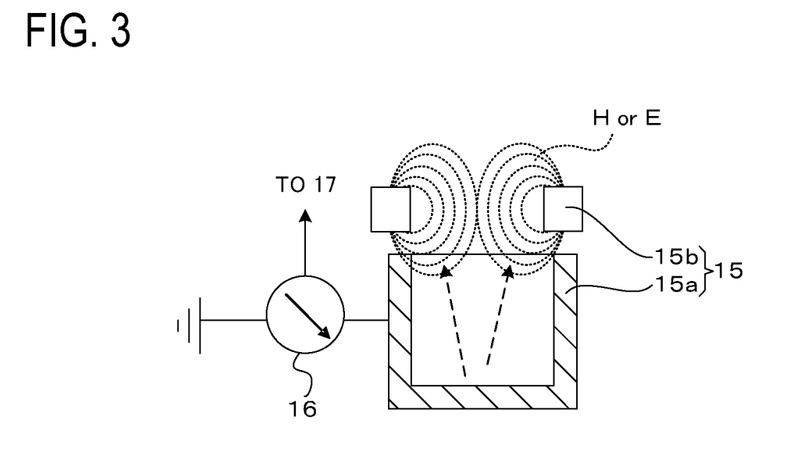
FIG. 3 is a sectional view illustrating an example of a fitting position of the current measuring device constituting the ion implantation apparatus according to the embodiment of the present invention.

As illustrated in FIG. 3, for example, the current measuring device 15 includes a conductive cup 15a having an inner concave surface on which the ion beam is irradiated, and a suppressor 15b arranged in vicinity of the peripheral edge of the opening of the cup 15a. A value of the electric current of the ion beam irradiated in the cup 15a is measured by using an ampere meter 16.

The cup 15a is arranged such that its bottom surface faces the ion exit port of the arc chamber 1a trough the opening portion 4a of the magnet chamber 4. An inner diameter of the cup 15a is determined by a height of the magnet chamber 4, and is set to 30 mm to 100 mm, for example. The cup 15a is smaller than a Faraday cup 22 described later, and has a size that enables the measurement of a profile of an electric current density distribution of the ion beam.

A secondary electron generated by the collision between the ion beams in the cup 15a is returned to the cup 15a by the magnetic field H or an electric field E produced by the suppressor 15b. Thus, the electric current value is corrected.

The electric current value of the ion beam irradiated in the cup 15a is measured by the ampere meter 16, and then a measured value is transferred to an electrode control portion 17. The electrode control portion 17 has a CPU, a memory portion, and the like, and controls the extraction electrode moving portion 8 for changing a position of the slit 2s of the extraction electrode 2.

Further, the electrode control portion 17 stores plural pieces of data of the relationship between the position of the extraction electrode 2 and the electric current value of the ion beam, and then forms a profile of the electric current density distribution in the direction that is set across the ion beam, as the measured result. Further, the electrode control portion 17 detects the position of the extraction electrode 2, in which the electric current measured value of the current measuring device 15 is maximized, based on the electric current measured result, and transmits a signal, which is used to set the extraction electrode 2 to that position, to the extraction electrode moving portion 8.

An open end of a wafer chamber 14 in which the mass slit electrode 6, the wafer stage 5, and the like are housed is connected to the ion beam emitting end of the magnet chamber 4. Here, the magnet chamber 4 and the wafer chamber 14 are insulated mutually via the insulator 12.

The mass slit electrode 6 has the mass slit 6s that selects one of plural ion species that pass through the mass analyzing magnet 3 and passes the ion species there. The mass slit electrode 6 is arranged to move along the direction that intersects with the traveling direction of the ion beam. Also, the mass slit electrode 6 is moved by a mass slit electrode moving portion 18.

The wafer stage 5 has the face to which the wafer W serving as an ion irradiation target is fitted, and has a structure that is moved by a stage driving portion 19. When the ions are implanted into the wafer W, the wafer stage 5 is moved by the stage driving portion 19 in the direction, which intersects with the ion beam traveling direction, to make an ion implantation in-plane distribution in the wafer W uniform.

A profiler 20 for measuring the electric current value of the ion beam, the ion irradiation area, the electric current density distribution, and the like is fitted to the side portion of the wafer stage 5.

The profiler 20 is moved in the direction that is set across the ion beam, for example. The profiler 20 may have a structure whose direction is changed, and a movement and a direction of the structure are controlled by the stage driving portion 19. For example, the stage driving portion 19 may face an ion detecting surface 20a of the profiler 20 toward the mass slit 6s when the ion beam electric current is to be measured, while the stage driving portion 19 may direct the ion detecting surface 20a sideward when the ion beam is to be irradiated onto the wafer W.

The electric current detected by the profiler 20 is measured by a mass slit electrode control portion 21 in which an ampere meter is built.

The mass slit electrode control portion 21 has a CPU, a memory portion, and the like, and acquires position data of the profiler 20 and then stores the data while correlating with the detected electric current value. Also, the mass slit electrode control portion 21 measures the ion beam electric current while changing the position of the mass slit 6s of the mass slit electrode 6 by controlling the mass slit electrode moving portion 18, and thus forms a profile of the electric current density of the ion beam to detect its gravity center.

The mass slit electrode moving portion 18 moves the mass slit electrode 6 in response to a command signal of the mass slit electrode control portion 21, and achieves an alignment of center of the mass slit 6s and a gravity center of the profile of the electric current density distribution of the ion beam.

The Faraday cup 22 is arranged at the back of the wafer stage 5. The Faraday cup 22 to be irradiated with the ion beams being out of the wafer stage 5 is used to measure intermittently a quantity of electric current of the ion beams.

In this case, the source chamber 11, the magnet chamber 4, and the wafer chamber 14 are connected mutually in an airtight state. Also, a pressure in their interior areas is reduced into a vacuum state of $1 \times 10^{-4}$ Pa to $1 \times 10^{-7}$ Pa, for example, by a rotary pump, a turbo molecular pump, or the like (not illustrated).

Next, a method of implanting ions into the wafer W on the wafer stage 5 by using the above ion implantation apparatus will be described with reference to FIG. 4A and FIG. 4B below.

Following processes are carried out before or after implanting the ions into the target, such as setup time for an ion beam, or a subsequent process of changing the wafer cassette.

First, a pressure in the source chamber 11, the magnet chamber 4, and the wafer chamber 14 is reduced to a given pressure, and generation of the magnetic field by using the mass analyzing magnet 3 is stopped.

Figure 4A:
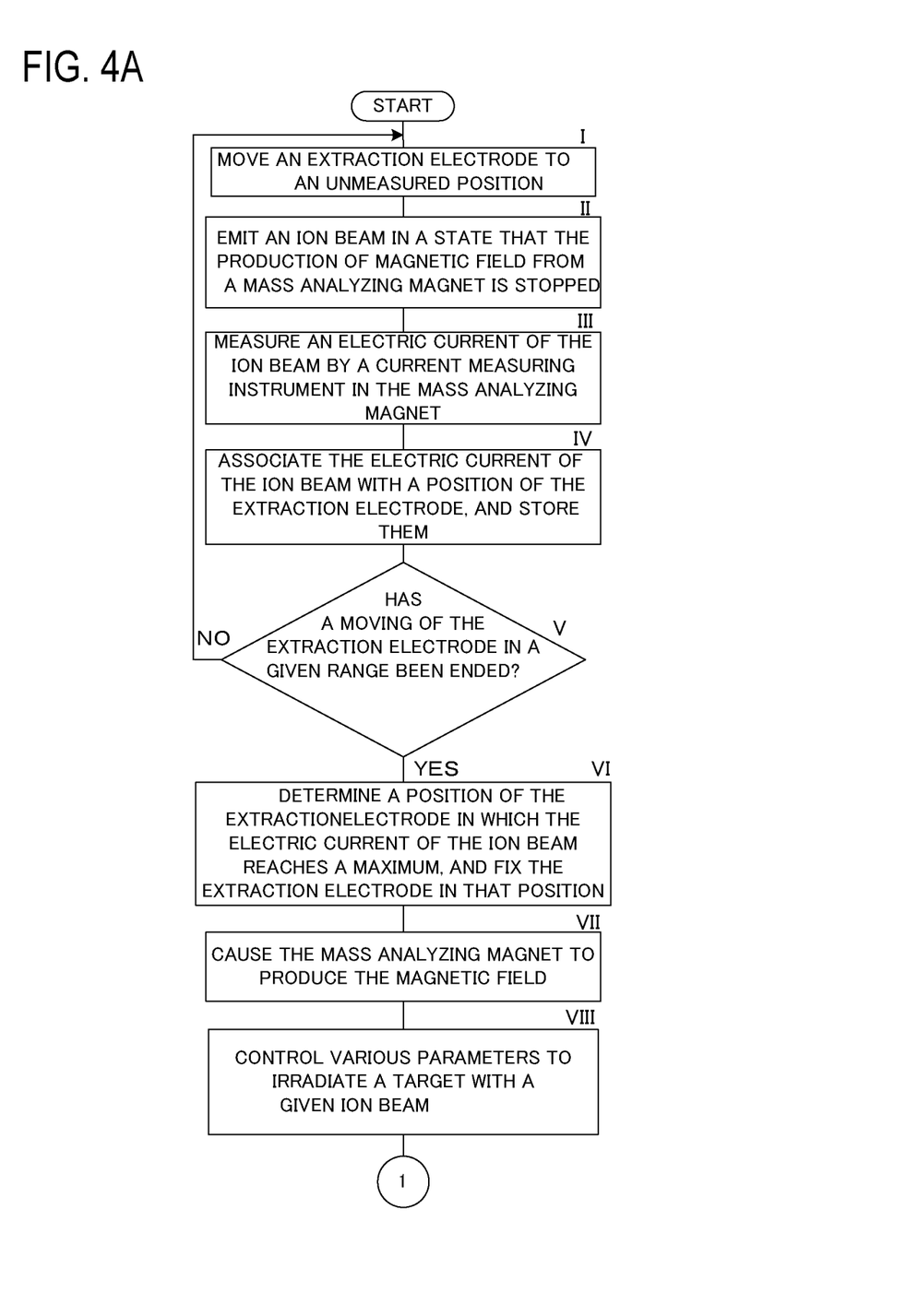
FIG. 4A is a first flowchart illustrating an example method of controlling an ion beam according to the embodiment of the present invention.

In such a state, as illustrated in FIG. 4A, I, the electrode control portion 17 moves the extraction electrode 2 to an initial position via the extraction electrode moving portion 8.

Also, a gas is supplied to the source head 1 from the gas source 9 to generate the plasma in the source head 1. Also, an electric potential difference is caused between the cathode in the arc chamber 1a and the extraction electrode 2 by the acceleration power supply 7. Accordingly, as illustrated in FIG. 4A, II, the positive ions are extracted toward the extraction electrode 2 from the arc chamber 1a to emit the ion beam.

The ion species form the ion beam as ion cluster. Then, the ion beam is accelerated by a given energy and passes through the slit 2s of the extraction electrode 2, and then goes straight on toward the magnet chamber 4.

In a state that the magnetic field produced by the mass analyzing magnet 3 does not exist in the magnet chamber 4, the ion beam being entered into the magnet chamber 4 goes straight ahead as it is, and then arrives at the current measuring device 15 or its neighborhood located on the side of the magnet chamber 4.

As illustrated in FIG. 4A, III, a strength of the ions irradiating to the current measuring device 15 is measured by the ampere meter 16 as an electric current. As illustrated in FIG. 4A, IV, the measured value is associated with position data of the extraction electrode 2, and is stored in the electrode control portion 17.

Then, the electrode control portion 17 changes the position of the extraction electrode 2 via the extraction electrode moving portion 8, then causes the current measuring device 15 and the ampere meter 16 to measure a quantity of the electric current of the ion beam that passes through the slit 2s in that position, and then stores the measured value together with the position of the extraction electrode 2 (FIG. 4A, I to IV).

As illustrated in FIG. 4A, V, the electrode control portion 17 repeats sequentially the moving of the extraction electrode 2, the measurement of the electric current of the ion beam, and the storing of them. Then, the electrode control portion 17 associates the position of the extraction electrode 2 with the electric current measured by the current measuring device 15, and detects the profile of the electric current density distribution of the ion beam measured by the current measuring device 15. In this manner, the reason why the electric current density distribution appears in the irradiation area of the ion beam is that the ions are dispersed and has the spread.

Then, as illustrated in FIG. 4A, V and VI, after the moving of the extraction electrode 2 in a given range and the measurement of the electric current are ended, the electrode control portion 17 outputs a command indicating that the extraction electrode 2 is moved to the position at which the electric current of the ion beam reaches a maximum to the extraction electrode moving portion 8, and fixes the extraction electrode 2 in that position. Here, the worker may issue the command for the extraction electrode moving portion 8 based on the measured result of the electric current of the ion beam.

The ion beam irradiating area of the current measuring device 15 is a certain amount of area lager than an infinitesimal dot. Thus, by aligning the extraction electrode 2 with an area in which the measured electric current value of the ion beam is the largest value, a center of gravity of the ion beam coincides with a center of the designed trajectory. Accordingly, the ion beam is irradiated perpendicularly on the beam incident port of the mass analyzing magnet 3.

Then, the acceleration power supply 7 connected to the extraction electrode 2 is turned OFF so that the emission of the ion beam is stopped.

Then, as illustrated in FIG. 4A, VII, the magnetic field is produced in the magnet chamber 4 by supplying a signal to the mass analyzing magnet 3 from the beam trajectory control circuit 13. Then, as illustrated in FIG. 4A, VIII, in order to implant a given ion species into the wafer W, various parameters containing selection of the gas species, adjustment of a gas flow rate, and adjustment of the acceleration voltage are controlled.

Then, the profiler 20 is moved by the stage driving portion 19 to face to the mass slit electrode 6. Then, as illustrated in FIG. 4B, IX, the mass slit electrode moving portion 18 moves the mass slit electrode 6 to the initial position in response to the command signal of the mass slit electrode control portion 21.

Then, when the ion beam is emitted from the source head 1, such an ion beam passes through the slit 2s of the extraction electrode 2, then enters perpendicularly into the incident port of the magnet chamber 4 via the straight line trajectory, and then draws the circular trajectory by the magnetic field in the magnet chamber 4. Such a curved trajectory is controlled by the beam trajectory control circuit 13.

In this case, plural gas species are separated due to differences of masses and numbers or quantities of their respective electric charges, and the undesired ion species arrive at the wall surface of the magnet chamber 4 or diverge from the target trajectory. The ion whose mass is smaller is curved more largely in the uniform magnetic field.

Also, the undesired ion species that have pass through the magnet chamber 4 are irradiated on the mass slit electrode 6 located around the mass slit 6s and then are provided to the outside. On the contrary, the ion beam of the given ion species is emitted in a straight line from the magnet chamber 4 to form the designed curved trajectory in the magnet chamber 4, then passes through the mass slit 6s, and then reaches the ion detecting surface 20a of the profiler 20. A value of electric current of the ion beam being irradiated on the ion detecting surface 20a is measured by the mass slit electrode control portion 21, and is stored in the mass slit electrode control portion 21 in association with the position of the mass slit 6s.

Figure 4B:
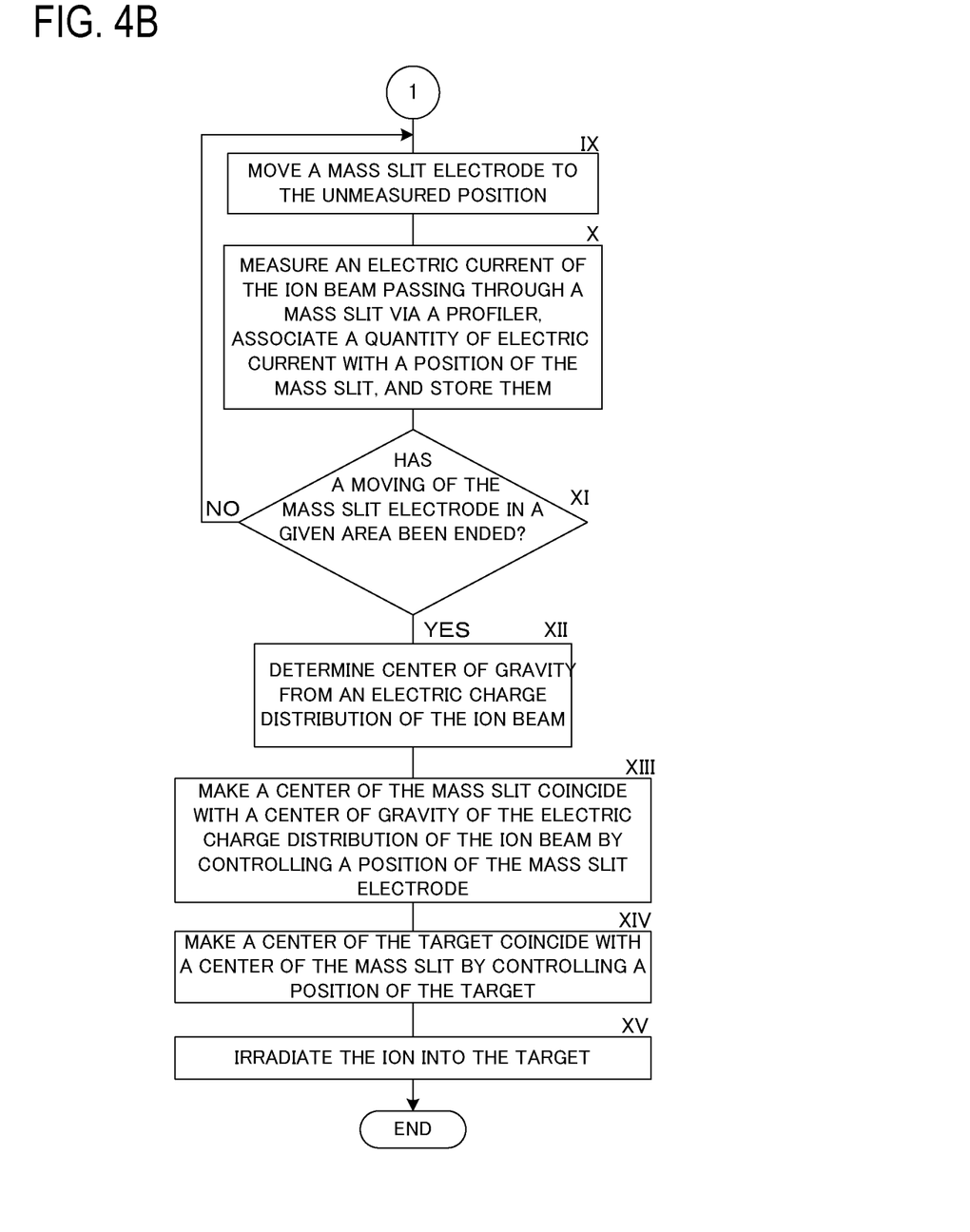
FIG. 4B is a second flowchart illustrating the example method of controlling the ion beam according to the embodiment of the present invention.

Then, as illustrated in FIG. 4B, IX, X and XI, the mass slit electrode control portion 21 shifts slightly the mass slit electrode 6 via the mass slit electrode moving portion 18, then associates the electric current value of the ion beam being irradiated on the profiler 20 therewith the position of the mass slit 6s, and stores them. Then, the mass slit electrode control portion 21 performs a sequence of these operations repeatedly.

As illustrated in FIG. 4B, XII, the mass slit electrode control portion 21 cumulatively stores the data of the relationship between the electric current value measured as above and the mass slit 6s, then determines the electric current distribution of the ion beam based on the stored data, and then calculates a gravity center of the ion beam.

Then, as illustrated in FIG. 4B, XIII, the mass slit electrode control portion 21 controls the position of the mass slit electrode 6 by sending the command to the mass slit electrode moving portion 18, and thus makes a center of the mass slit 6s coincide with a gravity center of the electric current density distribution of the ion beam. In this case, an operator may issue the command for the mass slit electrode moving portion 18 based on the data of the electric current of the ion beam.

Then, the ion emission from the source head 1 is stopped.

Then, the stage driving portion 19 causes the profiler 21 to move sideward from the front of the mass slit electrode 6, and also faces the wafer stage 5 toward the face of the mass slit electrode 6. Then, as illustrated in FIG. 4B, XIV, the stage driving portion 19 controls the position of the wafer stage 5 such that a center of the wafer W as the target coincides with a center of the mass slit 6s.

In this state, the ion beam is emitted from the source head 1. Then, as illustrated in FIG. 4B, XV, the ion beam passes through the extraction electrode 2, the mass analyzing magnet 3, and the mass slit 6s, and is implanted perpendicularly into the wafer W while following the designed trajectory.

As described above, when the trajectory of the ion beam is controlled by using the current measuring device 15, the incident trajectory of the ion beam into the mass analyzing magnet 3 is set to meet an ideal trajectory and an ideal incident angle.

Figure 5:
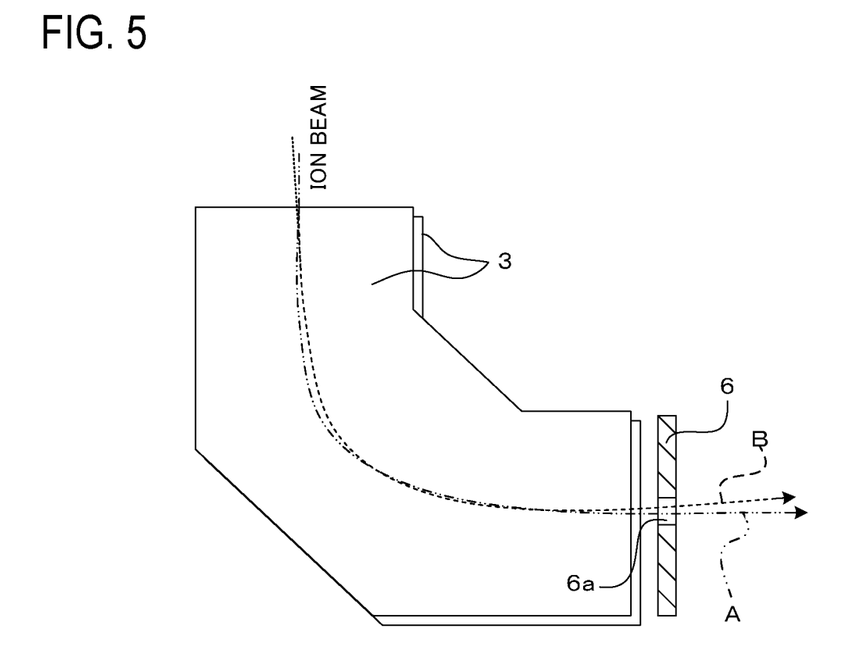
FIG. 5 is a view illustrating example trajectories of respective ion beams in the ion implantation apparatus according to the embodiment of the present invention and the ion implantation apparatus for reference.

Accordingly, as indicated by a chain double-dashed line A in FIG. 5, the trajectories of respective ion beams in the mass analyzing magnet 3 is set to trace the ideal flying trajectory, and an implantation angle of a gravity center of the ion beam into the wafer W is set perpendicularly to the wafer surface.

Figure 6:
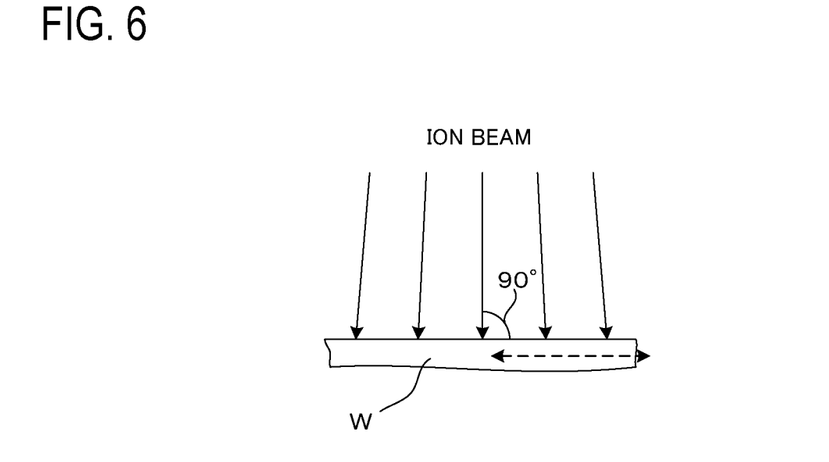
FIG. 6 is a view illustrating an example incident state of an ion beam by the ion implantation apparatus according to the embodiment of the present invention.

In this case, as illustrated in FIG. 6, since the flux of ions in the ion beam has a spread caused due to the dispersion, a part of the ion beam is irradiated not perpendicularly but obliquely on the surface of the wafer W. In this case, as illustrated in FIG. 7A, when a gravity center of the electric current distribution of the ion beam is caused to coincide with a center of the mass slit 6s and also the wafer stage 5 is moved along the surface of the mass slit electrode 6, an average incident angle of the ion beam is set substantially perpendicularly to the surface of the wafer.

In contrast, when the electric current of the ion beam is not measured by the current measuring equipment 15 and, as illustrated broken line B in FIG. 5, the ion beam is not irradiated on the mass analyzing magnet 3 via the given straight line trajectory, it is difficult to irradiate the ion beam substantially perpendicularly onto the surface of the wafer W by controlling the magnetic field produced by the mass analyzing magnet 3.

Figures 7A, 7B:
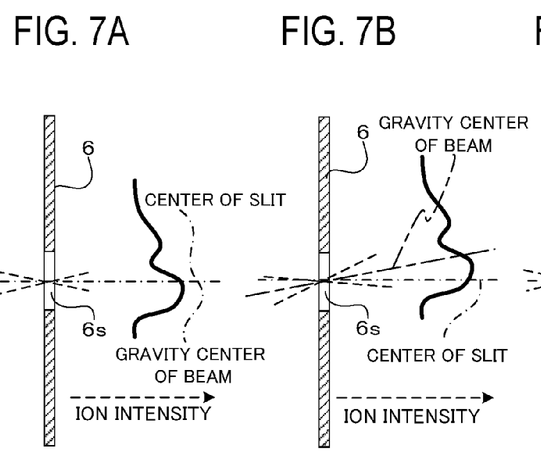
FIG. 7A is a view illustrating an example positional relationship between an intensity distribution of the ion beam controlled by an ion beam controlling method according to the embodiment of the present invention and a mass slit.
FIG. 7B is a view illustrating an example positional relationship between an intensity distribution of the ion beam according to the reference and a mass slit.

In this case, as illustrated in FIG. 7B, the ion beam is irradiated obliquely on the surface of the wafer w. Therefore, even though a gravity center of the ion beam is caused to coincide with a center of the mass slit 6s, a gravity center of the electric current distribution of the ion beam is displaced from the target position of the surface of the target.

Figure 7C:
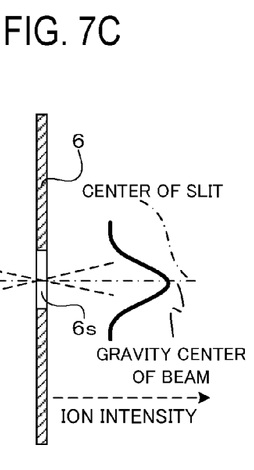
FIG. 7C is a view illustrating an example positional relationship between the ion beam of normal distribution controlled by the ion beam controlling method according to the embodiment of the present invention and a mass slit.

In this case, as illustrated in FIG. 7C, it is desired that the electric current distribution of the ion beam that passed through the mass slit 6s has a normal distribution. However, in many cases such distribution varies slightly while the ion beam follows the circular trajectory produced by the magnetic field of the mass analyzing magnet 3.

By the way, a displacement of a gravity center of the ion beam is also caused by degradation of the consumable component, adhesion of the product in the vacuum chamber, and the like. When a gravity center of the ion beam is displaced, the source parameter is controlled normally. This control aims at making a maximum peak point of the electric current density distribution coincide with a center of the beam trajectory on the assumption that the electric current density of the ion beam has a normal distribution.

Therefore, when a gravity center of the electric current density distribution of the ion beam is displaced from a center of the beam trajectory, sometimes the ion beam is not implanted substantially perpendicularly to the surface of the wafer.

Figure 8:
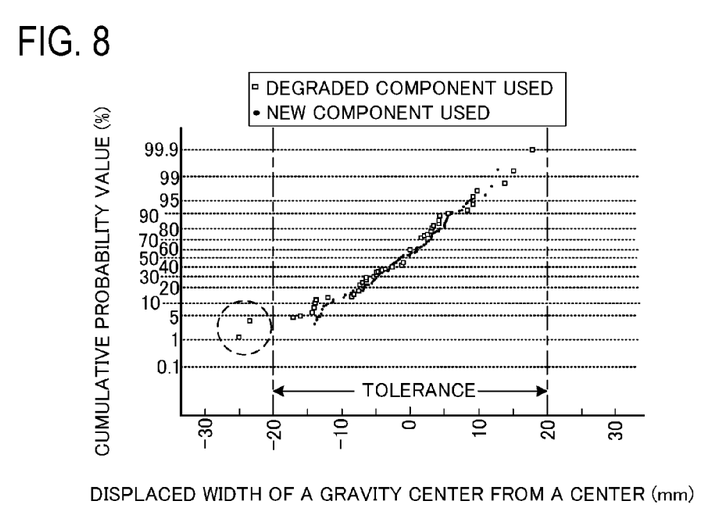
FIG. 8 is a view illustrating an example probability of displacement of a gravity center of a current distribution of the ion beam from a center of the mass slit before the component of the ion implantation apparatus according to the reference is changed and after the component of the same is changed.

When a displacement of a gravity center of the ion beam from a center of the designed trajectory is investigated, the results illustrated in FIG. 8 are obtained. FIG. 8 illustrates the variations of a gravity center of the ion beam before and after the source head 1 is changed. In this case, zero (0) mm on an abscissa in FIG. 8 indicates a center of the designed trajectory.

In FIG. 8, centers of gravity are located within a tolerance ±20 mm of the displacement even after the source head 1 is changed. However, before the change of the source head as indicated with a broken-line circle in FIG. 8, the gravity center may beyond the bounds of permissibility. In such case, the trajectory of the ion beam is controlled by means of the current measuring device 15 so that the incident trajectory of the ion beam into the mass analyzing magnet 3 is set as designed. Thus, the ion beam trajectory is given without displacement.

Next, an example in which the ion implantation apparatus and the ion implanting method are applied to the steps of manufacturing a semiconductor device will be described below.

FIG. 9A to FIG. 9E are sectional views illustrating an example of the steps of forming a semiconductor device according to the embodiment of the present invention.

Figure 9A:
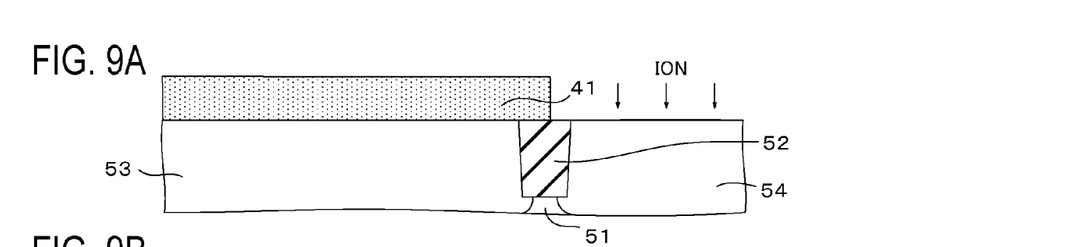
FIG. 9A to FIG. 9E are sectional views illustrating example steps of forming a semiconductor device according to the embodiment of the present invention.

First, the steps required until a structure illustrated in FIG. 9A is formed will be described below.

A shallow trench isolation 52 is formed as the element isolation insulating structure in the element isolation area of a silicon substrate 51. The shallow trench isolation 52 is formed by filling the silicon oxide film in the recess after the recess is formed on the silicon substrate 51. In this case, an element isolation insulating film may be formed by the LOCOS method as the element isolation insulating structure.

Then, a sacrifice oxide film (not illustrated) is formed on the surface of the silicon substrate 51 in the active regions by the thermal oxidizing method. Then, a P-well 53 is formed in the first active region by implanting ions of a p-type impurity such as boron (B), or the like. Also, an N-well 54 is formed in the second active region by implanting ions of an n-type impurity such as phosphorus (P), arsenic (As), antimony (Sb), or the like.

The region into which the ions are not implanted is covered with a photoresist 41 when the ion implantation is applied while selecting the n-type impurity and the p-type impurity.

The p-type impurity for use in the formation of the P-well 53 is implanted into the silicon substrate 51 under the condition that the acceleration energy is set to 100 keV to 500 keV and a dosage is set to $5.0 \times 10^{12}/cm^3$ to $5.0 \times 10^{13}/cm^3$. Also, the n-type impurity for use in the formation of the N-well 54 is implanted into the silicon substrate 51 under the condition that the acceleration energy is set to 200 keV to 1000 keV and a dosage is set to $5.0 \times 10^{12}/cm^3$ to $5.0 \times 10^{13}/cm^3$.

In the ion implanting steps applied to form the P-well 53 and the N-well 54, the high-precision control of the ion implantation angle is not so required. However, the well forming regions may be narrowed more and more in the future according to the higher integration of the semiconductor device, so that the ion implantation angle may be controlled with higher precision.

In this case, the silicon substrate 51 as the wafer W illustrated in FIG. 1 is put on the wafer stage 5, and then various ions may be implanted perpendicularly into the silicon substrate 51 in accordance with the flow illustrated in FIG. 4A and FIG. 4B.

More particularly, the extraction electrode 2 is moved to the position at which the measured value of the electric current of the ion beam is measured by the current measuring device 15 is maximized in a state that the magnetic field produced by the mass analyzing magnet 3 is turned OFF. Further, a center of the mass slit 6s is made to coincide with a gravity center of the given species ion beam in a state that the magnetic field is produced by the mass analyzing magnet 3. As a result, the ion beam emitted from the source head 1 is implanted substantially perpendicularly to the surface of the silicon substrate 51.

The silicon substrate 51 is annealed at a given temperature to activate the impurity after the ions of the impurity are implanted into the silicon substrate 51. Further, the activation will be applied in the n-type impurity or p-type impurity ion implanting step described later.

Figure 9B:
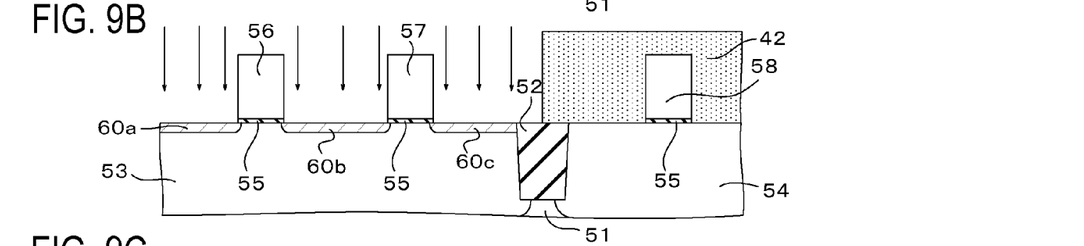

Next, the steps required until a structure illustrated in FIG. 9B is formed will be described below.

A silicon oxide film is formed as a gate insulating film 55 by the thermal oxidizing method, the CVD method, and the like on an upper surface of the silicon substrate 51 on which the P-well 53 and the N-well 54 are formed.

Then, a polysilicon film is formed on the gate insulating film 55 by the CVD method to have a thickness of about 100 mm. Then, the polysilicon film is patterned by the photolithography method. Thus, first and second gate electrodes 56, 57 are formed on the P-well 53, and also a third gate electrode 58 is formed on the N-well 54.

Pattern widths (gate length) of the first, second, and third gate electrodes 56, 57, 58 are from about 30 nm to about 90 nm.

Then, a photoresist is coated on the silicon substrate 51, and then is exposed and developed. Thus, a first resist pattern 42 is shaped to cover the N-well 54 and the third gate electrode 58 and expose the area of the P-well 53.

Then, ions of the arsenic, for example, are implanted as the n-type impurity into the P-well 53 exposed from the first resist pattern 42. In this case, the acceleration energy for the ion implantation is set to 1.0 keV to 10 keV, and a dosage is set to $5.0 \times 10^{14}/cm^3$ to $5.0 \times 10^{15}/cm^3$.

In this step, the silicon substrate 51 is put on the wafer stage 5.

Then, various ions are implanted perpendicularly into the silicon substrate 51 in accordance with the flow illustrated in FIG. 4A and FIG. 4B. Thus, the extraction electrode 2 is moved to the position where the electric value measured value of the ion beam measured by the current measuring device 15 is maximized in a state that the magnetic field produced by the mass analyzing magnet 3 is turned OFF, and a center of the mass slit 6s is made to coincide with a gravity center of the n-type impurity ion beam in a state that the magnetic field is produced by the mass analyzing magnet 3.

In a such state, the ion beam emitted from the source head 1 is implanted substantially perpendicularly to the surface of the silicon substrate 51.

In this manner, the n-type impurity is implanted in the perpendicular direction to the upper surface of the silicon substrate 51. Thus, first, second, and third n-type extension regions 60a, 60b, 60c are formed on the surface layer of the P-well 53 on both sides of the first and second gate electrodes 56, 57 respectively. At that time, the patterns of the polysilicon film constituting the first and second gate electrodes 56, 57 are changed to the conductive patterns by ion-implanting the n-type impurity.

After the ion implantation, the first resist pattern 42 is removed.

Figure 9C:
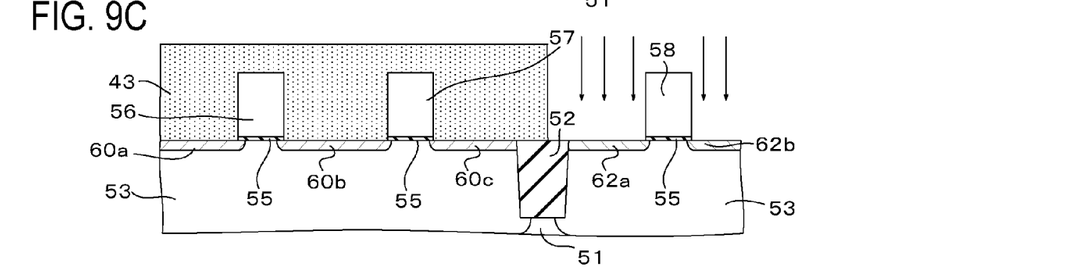

Then, as illustrated in FIG. 9C, a photoresist is coated on the silicon substrate 51, and is exposed and developed. Thus, a second resist pattern 43 is shaped to cover the first and second gate electrodes 56, 57 and expose the area of the N-well 54.

Then, ions of the boron, for example, are implanted as the p-type impurity into the N-well 54 exposed from the second resist pattern 43. In this case, the acceleration energy for the ion implantation is set to 0.1 keV to 5.0 keV, and a dosage is set to $5.0 \times 10^{14}/cm^3$ to $5.0 \times 10^{15}/cm^3$.

In this step, the silicon substrate 51 is put on the wafer stage 5. Then, various ions are implanted perpendicularly into the silicon substrate 51 in accordance with the flow illustrated in FIG. 4A and FIG. 4B. Thus, the extraction electrode 2 is moved to the position where the electric value measured value of the ion beam measured by the current measuring device 15 is maximized in a state that the magnetic field produced by the mass analyzing magnet 3 is turned OFF, and a center of the mass slit 6s is made to coincide with a gravity center of the boron ion beam in a state that the magnetic field is produced by the mass analyzing magnet 3. Accordingly, the ion beam emitted from the source head 1 is implanted substantially perpendicularly to the surface of the silicon substrate 51.

In this manner, ions of the boron are implanted in the perpendicular direction to the upper surface of the silicon substrate 51. Thus, first and second p-type extension regions 62a, 62b are formed on the N-wells 54 on both sides of the third gate electrode 58 respectively. At that time, the pattern of the polysilicon film constituting the third gate electrode 58 is changed to the conductive pattern by ion-implanting the p-type impurity.

After the ion implantation, the second resist pattern 43 is removed.

Figure 9D:
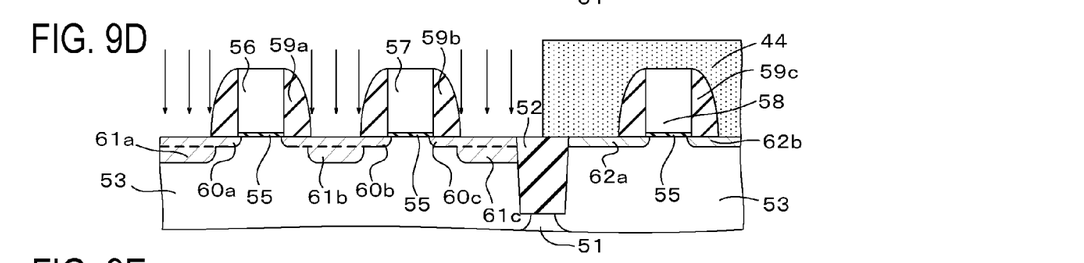

Next, the steps required until a structure illustrated in FIG. 9D is formed will be described below hereunder.

First, a silicon oxide film, for example, is formed as an insulating film on the entire upper surface of the silicon substrate 51 by the CVD method. Then, the insulating film is etched back. Thus, the surface of the silicon substrate 51 is exposed, and also the insulating film is left on the side surfaces of the first, second, and third gate electrodes 56, 57, 58 as sidewalls 59a, 59b, 59c, respectively.

Then, like the steps of forming the first, second, and third n-type extension regions 60a, 60b, 60c, the N-well 54 and the third gate electrode 58 are covered with a third resist pattern 44 but the area of the P-well 53 is exposed.

Then, the silicon substrate 51 is put on the wafer stage 5 of the ion implantation apparatus, and then ions of the n-type impurity are implanted into the P-well 53 exposed from the third resist pattern 44.

In this ion implanting step, the trajectory of the ion beam is controlled like the ion implantation applied to form the first, second, and third n-type extension regions 60a, 60b, 60c, a gravity center of the n-type impurity ion beam is set to coincide with a center of the mass slit 6s.

Then, ions of the n-type impurity, e.g., arsenic, are implanted in the substantially perpendicular direction into the upper surface of the silicon substrate 51 by using the first and second gate electrodes 56, 57 and the sidewalls 59a, 59b as a mask. In this case, the acceleration energy for the ion implantation is set to 5.0 keV to 15 keV, and a dosage is set to $1.0 \times 10^{15}/cm^3$ to $1.0 \times 10^{16}/cm^3$.

Accordingly, first, second, and third n-type source/ drain diffusion regions 61a, 61b, 61c are formed in the P-well 63 on both sides of the first and second gate electrodes 56, 57. At that time, the n-type impurity is also implanted into the polysilicon film constituting the first and second gate electrodes 56, 57, and thus a resistance of the first and second gate electrodes 56, 57 is made smaller.

The first n-type source/drain diffusion region 61a overlaps with a part of the first n-type extension region 60a, the second n-type source/drain diffusion region 61b overlaps with a part of the second n-type extension region 60b and the third n-type source/drain diffusion region 61c overlaps with a part of the third n-type extension region 60c.

After the ion implantation, the third resist pattern 44 is removed.

Figure 9E:
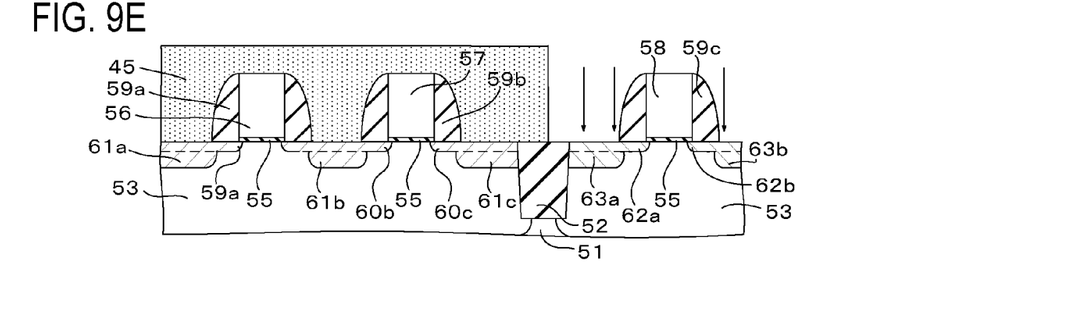

Then, as illustrated in FIG. 9E, like the steps of forming the first and second p-type extension regions 62a, 62b, the P-well 53 and the first and second gate electrodes 56, 57 are covered with a fourth resist pattern 45, and the area of the N-well 54 is exposed.

Then, the silicon substrate 51 is put on the wafer stage 5 of the ion implantation apparatus, and then the boron is ion-implanted as the p-type impurity into the N-well 54 exposed from the fourth resist pattern 45. In this case, the acceleration energy for the ion implantation is set to 3.0 keV to 10 keV, and a dosage is set to $1.0 \times 10^{15}/cm^3$ to $1.0 \times 10^{16}/cm^3$.

In this ion implanting step, the trajectory of the ion beam is controlled like the ion implanting step applied to form the first and second p-type extension regions 62a, 62b, and a gravity center of the boron ion beam is set to coincide with a center of the mass slit 6s.

Then, ions of the boron are implanted in the perpendicularly perpendicular direction to the upper surface of the silicon substrate 51 by using the third gate electrode 58 and the sidewall 59c as a mask. Accordingly, first and second p-type source/drain diffusion regions 63a, 63b are formed in the N-well 54 on both sides of the third gate electrode 58. At that time, the p-type impurity is also implanted into the polysilicon film constituting the third gate electrode 58, and thus a resistance of the third gate electrode 58 is made smaller.

The first p-type source/drain diffusion region 63a overlaps with a part of the first p-type extension region 62a, and the second p-type source/drain diffusion region 63b overlaps with apart of the second p-type extension region 62b.

After the ion implantation, the fourth resist pattern 45 is removed.

After the first and second p-type source/drain diffusion regions 63a, 63b are formed, a metal silicide layer, although not particularly illustrated, is formed on respective upper layers of the first to third gate electrodes 56, 57, 58, the first to third n-type source/drain diffusion regions 61a, 61b, 61c, and the first and second p-type extension regions 62a, 62b.

A first N-type MOSFET includes the P-well 53, the first gate electrode 56, the first and second n-type source/drain diffusion regions 61a, 61b, and the like, all being formed in the above steps. Also, a second N-type MOSFET includes the P-well 53, the second gate electrode 57, the second and third n-type source/drain diffusion regions 61b, 61c, and the like. Also, a P-type MOSFET includes the N-well 54, the third gate electrode 58, the first and second p-type source/drain diffusion regions 63a, 63b, and the like.

Then, an interlayer insulating film for covering the first and second N-type MOSFETs and the P-type MOSFET is formed.

As described above, the ion implantation apparatus illustrated in FIG. 1 is employed to form the n-type extension regions 60a, 60b, 60c, the n-type source/drain diffusion regions 61a, 61b, 61c, the p-type extension region 62a, 62b, the p-type source/drain diffusion regions 63a, 63b, and the like. Also, the impurity ions are implanted perpendicularly to the surface of the substrate by employing the ion implanting method illustrated in FIG. 4A and FIG. 4B.

Thus, the position of the extraction electrode 2 is controlled while monitoring the ion beam emitted from the source head 1 by the current measuring device 15, and thus the extraction electrode 2 is placed in the position where the electric current measured value of the ion beam is maximized, As a result, the ion beam is irradiated on the mass analyzing magnet 3 through the given straight line trajectory, and also the impurity is implanted perpendicularly to the surface of the silicon substrate 51 by guiding the ion beam deflected by the magnetic field of the mass analyzing magnet 3 on the designed flying trajectory.

Accordingly, the impurity concentration distribution of the first and second n-type extension regions 60a, 60b of the first N-type MOSFET in the plane direction and the depth direction respectively is set bi-horizontally symmetrically with respect to the gate electrode 56.

Also, the impurity concentration distribution of the first and second n-type source/drain diffusion regions 61a, 61b in the plane direction and the depth direction respectively is formed in bilaterally-symmetric distribution with respect to the gate electrode. Thus, the transistor characteristics of the first N-type MOSFET are improved.

Such symmetry is similarly true of the second and third n-type extension regions 60b, 60c and the second and third n-type source/drain diffusion regions 61b, 61c of the second N-type MOSFET. Also, such symmetry is similarly true of the first and second p-type extension regions 62a, 62b and the first and second p-type source/drain diffusion regions 63a, 63b constituting the P-type MOSFET.

Meanwhile, when the trajectory of the ion beam is modified by means of the control of the mass analyzing magnet 3 not to monitor the electric current of the ion beam by the current measuring device 15, a gravity center of the ion beam is hard to coincide with a center of the mass slit 6s. As a result, in the first N-type MOSFET, for example, an offset is easily caused between the first and second n-type extension regions 60a, 60b and the gate electrode 56 and the between the first and second n-type source/drain diffusion regions 61a, 61b and the gate electrode 56.

Figure 10A:
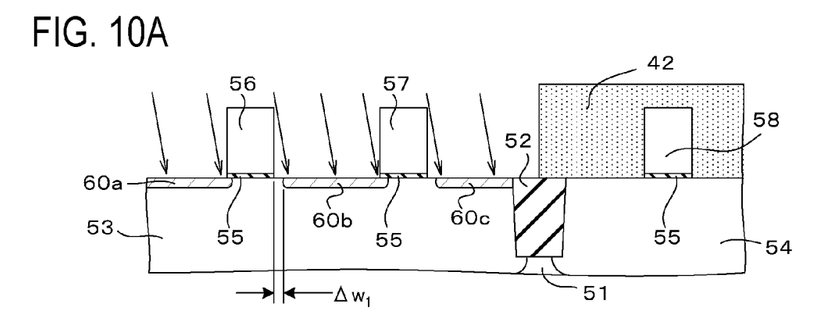
FIG. 10A and FIG. 10B are sectional views illustrating example steps of forming a semiconductor device according to the reference.

For example, as illustrated in FIG. 10A, in the step of forming the first, second, and third n-type extension region 60a, 60a, 60c, when the ion beam is irradiated on the surface of the silicon substrate 51 obliquely, i.e., at an angle other than 90 degree, a region in which the ion implantation into the silicon substrate 51 is shut out by the first and second gate electrodes 56, 57 is generated, and further a region in which the ions enter deeply into the regions located under the first and second gate electrodes 56, 57 appears.

Accordingly, a region in which the ions are not implanted or which comes short of the ions, i.e., an offset region $\Delta w_1$, appears between one side of the first gate electrode 56 and the second n-type extension region 60b. Similarly, an offset region appears on one side each of the second gate electrode 57 and the third gate electrode 58.

Figure 10B:
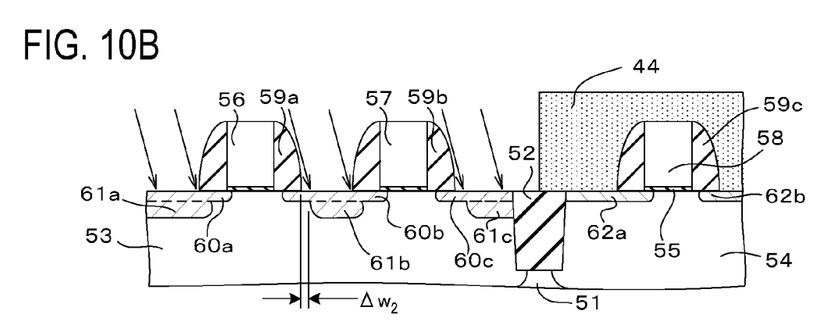

Also, as illustrated in FIG. 10B, in the step of forming the first, second, and third n-type source/drain diffusion regions 61a, 61b, 61c, the ion beam is irradiated obliquely on the surface of the silicon substrate 51. Thus, an offset region $\Delta w_2$ appears between one side of the first gate electrode 56 and the second n-type source/drain diffusion region 61b and between one side of the second gate electrode 57 and the third n-type source/drain diffusion region 61c.

A difference in the horizontal impurity concentration distribution each of the first and second gate electrodes 56, 57 is caused by such offset regions $\Delta w_1$, $\Delta w_2$. Thus, a difference between the forward electric current and the reverse electric current of the first and second N-type MOSFETs is increased. Thus, an asymmetry of the transistor characteristics becomes conspicuous.

As the cause why the ion implantation angle is inclined with respect to the upper surface of the silicon substrate 51, for example, it may be listed as one cause that a gravity center of the ion beam is out of alignment by the degradation of the consumable component, the adhesion of the product in the vacuum chamber, and the like.

As the measure against the displacement of the ion beam, the control of the source parameter is performed. In this control, it is common that, on the assumption that the electric current density distribution of the ion beam has a normal distribution, a peak position of the electric current density distribution is made to coincide with a center of the designed trajectory.

However, actually the peak position of the electric current density distribution of the ion beam and the target position of the wafer are different mutually.

The inventor has investigated a relation between the displacement of the gravity center of the electric current density distribution of the ion beam and an ON current of the MOSFET formed by the method containing the ion implantation. Thus, the results as illustrated in FIG. 11 are obtained, for example.

Figure 11:
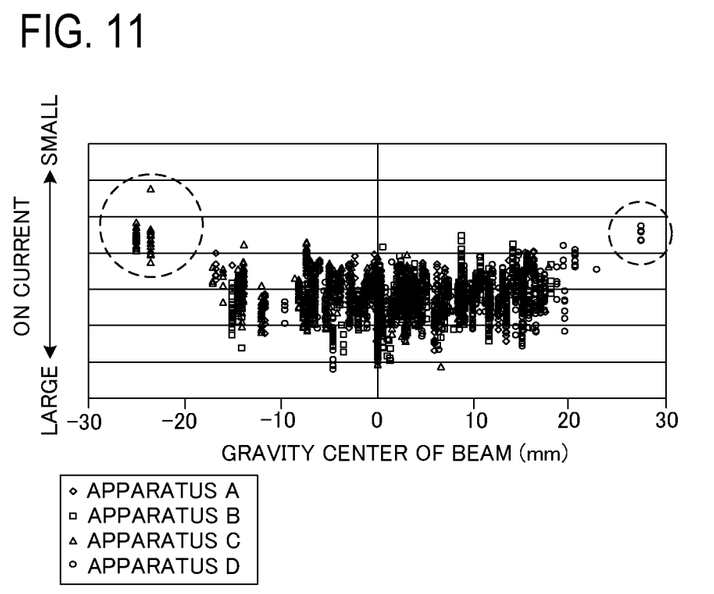
FIG. 11 is a view illustrating an example relation between the displacement of the gravity center of the current distribution of the ion beam from the center of the mass slit and an ON current of a transistor.

As encircled by a broken line in FIG. 11, when the displacement of the gravity center of the electric current density distribution of the ion beam is out of the tolerance, the ON electric current of the transistor is decreased.

As the reason why the ON electric current is decreased, the generation of the offset regions $\Delta w_1$, $\Delta w_2$ illustrated in FIG. 10A and FIG. 10B may be considered as the cause. Thus, when a gravity center of the electric current density distribution of the ion beam is displaced largely from a center of the mass slit 6s or the ion beam is irradiated obliquely to the surface of the substrate, the ions whose implantation angle to the surface of the substrate is not perpendicular are increased and the offset regions $\Delta w_1$, $\Delta w_2$ appear.

The influence of the offset regions on the transistor characteristics appears mainly in the extension regions. However, such influence also appears remarkably in the source/drain diffusion region when a width (gate length) of the gate electrode is reduced down to about 32 nm, for example.

In contrast, in the present embodiment, the trajectory of the ion beam is caused to coincide with the target flying trajectory by employing the current measuring device 15. Thus, the irradiated trajectory of the ion beam into the wafer is controlled with good precision, and the ion implantation angle is controlled perpendicularly to the surface of the wafer.

As described above, the incident trajectory of the ion beam into the mass analyzing magnet 3 is controlled by employing the current measuring device 15, so that the output angle of the ion beam of the mass analyzing magnet 3 is controlled with high precision. Therefore, the employment of the ion implantation apparatus and the ion implanting method is effective in controlling the ion implantation angle other than the perpendicular angle.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it is understood that the various changes, substitutions, and alterations could be made hereto without departing from the spirit and scope of the invention.

What is claimed is:

1. A method of manufacturing a semiconductor device comprising:
    outputting an ion beam from a source head;
    passing the ion beam through a slit of an extraction electrode;
    guiding the ion beam into a mass analyzing magnet, after passing the ion beam through the slit of the extraction electrode;
    irradiating the ion beam passing into the mass analyzing magnet to an electric current measuring device that is associated with the mass analyzing magnet and faces an ion exit port of the source head through the extraction electrode;
    measuring an electric current value with the electric current measuring device;
    positioning the slit of the extraction electrode based on the electric current value measured while stopping production of a magnetic field of the mass analyzing magnet;
    curving the ion beam passed through the positioned slit in a magnetic field produced by the mass analyzing magnet; and
    irradiating the ion beam curved by the mass analyzing magnetic field to a semiconductor substrate, by positioning a mass slit arranged between the mass analyzing magnet and the semiconductor substrate to make a gravity center of the ion beam coincide with a center of the mass slit, and an average incident angle of the ion beam being substantially perpendicularly to the semiconductor substrate.

2. The method of claim 1, wherein the ion beam is irradiated in source/drain regions in the semiconductor substrate while using a gate electrode of a transistor as a mask.

3. The method of claim 2, wherein the ion beam is irradiated in extension regions of the source/drain regions while using the gate electrode of the transistor as a mask.

4. The method of claim 1, wherein a trajectory of the ion beam entering into the mass analyzing magnet is controlled by positioning the slit based on the measured electric current value.

5. The method of claim 1, wherein the slit of the extraction electrode is placed at a position where the measured electric current value is maximized.

6. A method of controlling an ion beam, the method comprising:
    outputting an ion beam from a source head;
    passing the ion beam through a slit of an extraction electrode;

irradiating the ion beam into a mass analyzing magnet to an electric current measuring device that is associated with the mass analyzing magnet and faces an ion exit port of the source head through the extraction electrode;

measuring an electric current value of the ion beam by using the current measuring device;

controlling a position of the extraction electrode based on the measured electric current value; and controlling a position of a mass slit arranged between the mass analyzing magnet and a semiconductor substrate to make a gravity center of the ion beam coincide with a center of the mass slit, and an average incident angle of the ion beam being substantially perpendicularly to the semiconductor substrate.

7. The method of claim 6, wherein measuring the electric current value of the ion beam is measuring an intensity distribution of an electric current of the ion beam.

8. The method of claim 6, further comprising:

irradiating the ion beam in a direction perpendicular to a beam incident port of the mass analyzing magnet by controlling the position of the extraction electrode, before irradiating the ion beam to the electric current measuring device.

9. The method of claim 6, further comprising:

placing the extraction electrode at a position in which the measured electric current value is maximum.

\* \* \* \* \*